US012681118B2

(12) United States Patent　　　　　(10) Patent No.:　US 12,681,118 B2
Calderon Rico et al.　　　　　　　　　(45) Date of Patent:　　　Jul. 14, 2026

(54) COHERENCE FILTERING FOR MAGNETIC RESONANCE IMAGING (MRI) SIGNALS

(71) Applicant: KONINKLIJKE PHILIPS N.V., Eindhoven (NL)

(72) Inventors: Rodrigo Calderon Rico, Newberry, FL (US); Alton Keel, Gainseville, FL (US); Scott Bradley King, Gainesville, FL (US); Arne Reykowski, Newberry, FL (US); Tracy Allyn Wynn, Gainesville, FL (US); Solomon Peachy, Gainesville, FL (US)

(73) Assignee: Koninklijke Philips N.V., Eindhoven (NL)

( * ) Notice: Subject to any disclaimer, the term of this patent is extended or adjusted under 35 U.S.C. 154(b) by 201 days.

(21) Appl. No.: 18/686,459

(22) PCT Filed: Aug. 16, 2022

(86) PCT No.: PCT/EP2022/072806
　§ 371 (c)(1),
　(2) Date: Feb. 26, 2024

(87) PCT Pub. No.: WO2023/025614
　PCT Pub. Date: Mar. 2, 2023

(65) Prior Publication Data
　US 2025/0123347 A1　　Apr. 17, 2025

Related U.S. Application Data

(60) Provisional application No. 63/237,559, filed on Aug. 27, 2021.

(51) Int. Cl.
　*G01R 33/56*　　　(2006.01)

(52) U.S. Cl.
　CPC ................................. *G01R 33/5608* (2013.01)

(58) Field of Classification Search
　CPC ............................ G01R 33/56; G01R 33/5608
　See application file for complete search history.

(56) References Cited

U.S. PATENT DOCUMENTS 10,180,482 B2 * 1/2019 Huang ................. G01R 33/283
10,859,621 B2 * 12/2020 Yin ....................... G01R 31/002
(Continued)

FOREIGN PATENT DOCUMENTS

DE　　102011006578 A1　　10/2012
JP　　　2011206287 A　　　10/2011
JP　　　2012176044 A　　　9/2012

OTHER PUBLICATIONS

International Search Report and Written Opinion from PCT/EP2022/072806.
(Continued)

*Primary Examiner* — Gregory H Curran

(57)　　　　　ABSTRACT

A device (18) configured to filter magnetic resonance (MR) signals includes, at least one electronic processor (24) programmed to: receive at least one MR signal (26) excited in a subject disposed in an MR imaging device (10); transform the at least one MR signal with a coherence function representing the at least one MR signal as an instantaneous frequency spectrum as a function of time; apply spectral filtering to the transformed at least one MR signal; and reconstruct at least one medical image from the filtered at least one MR signal.

6 Claims, 5 Drawing Sheets

(56) References Cited

U.S. PATENT DOCUMENTS

| 11,467,238 B2 * | 10/2022 | Grinstead | ............ | G01R 33/565 |
| 2003/0210045 A1 | 11/2003 | Mitchell et al. | | |
| 2008/0080786 A1 | 4/2008 | Mitchell et al. | | |
| 2013/0300417 A1 | 11/2013 | Malaney et al. | | |
| 2020/0014106 A1 | 1/2020 | Guerel et al. | | |

OTHER PUBLICATIONS

Scholl "Fourier, Gabor, Morlet or Wigner: Comparison of Time-Frequency Transforms" arxiv.org Jan. 17, 2021.
Yousefian et al "A Coherence Based Algorithm for Noise Reduction in Dual Microphone Applications" 18th European Signal Processing Conference Aug. 2010.
Francois Auger, Patrick Flandrin, Paulo Goncalves, Olivier Lemoine, "Time-Frequency Toolbox—For use with Matlab," CNRS (France), Rice University (USA), 1995-1996.

* cited by examiner

COHERENCE FILTERING FOR MAGNETIC RESONANCE IMAGING (MRI) SIGNALS

CROSS REFERENCE TO RELATED APPLICATIONS

This application is a U.S. national phase application of International Application No. PCT/EP2022/072806 filed on Aug. 16, 2022, which claims the benefit of U.S. Application Ser. No. 63/237,559 filed on Aug. 27, 2021 and is incorporated herein by reference.

FIELD

The following relates generally to the magnetic resonance (MR) imaging arts, MR image reconstruction arts. MR signal processing arts, MR signal acquisition arts. MR signal filtering arts, and related arts.

BACKGROUND

Magnetic resonance (MR) imaging entails placing a subject (e.g., medical patient, veterinary subject, archaeological mummy, et cetera) in a static magnetic field (often referred to as a $B_0$ field) and exciting nuclear magnetic resonance in the subject and then detecting the excited magnetic resonance. For imaging, the excited MR is spatially encoded with respect to location, phase, and/or frequency by superimposing magnetic field gradients on the static $B_0$ magnetic field during the excitation, during a time interval between MR excitation and MR readout, and/or during the MR readout. In a typical design, the MR imaging device (sometimes referred to as an MRI scanner) includes a housing with a central bore within which the MR examination region is located. The static $B_0$ magnetic field is produced by solenoidal magnet windings wrapped around the central bore and housed within the MRI scanner housing. These solenoidal magnet windings are often superconducting windings in modern MRI scanners, and the housing includes a liquid helium (LHe) reservoir cooling the superconducting windings. Magnetic field gradient coils are also disposed in the housing around the central bore.

To provide the MR excitation in the case of a human subject, a body coil is commonly used, which is typically a cylindrical birdcage coil, TEM coil, or some variant thereof that is installed concentrically around the bore. Alternatively, a local coil positioned near the body anatomy to be imaged is used for excitation. MR readout is usually performed using a local MR receive coil positioned near the anatomy to be imaged. The local MR receive coil and the local MR excitation coil readout (if used) may be the same coil, or different coils. For various reasons, the MR receive coil may comprise an MR coil array that includes multiple coil elements, with each coil element typically configured as a loop coil, although other coil element designs are known. Such an MR coil array can implement a number of MR receive channels, e.g., a single coil element or a group of spatially contiguous coil elements may define one MR channel. Use of such a multi-channel MR receive coil has certain benefits. For example, sensitivity encoding (SENSE) or other parallel MR acquisition techniques leveraging the multiple receive channels can accelerate MR data acquisition.

The following discloses certain improvements to overcome these problems and others.

SUMMARY

In some embodiments disclosed herein, a device is configured to filter magnetic resonance (MR) signals includes at least one electronic processor programmed to: receive at least one MR signal excited in a subject disposed in an MR imaging device: transform the at least one MR signal with a coherence function representing the at least one MR signal as an instantaneous frequency spectrum as a function of time: apply spectral filtering to the transformed at least one MR signal; and reconstruct at least one medical image from the filtered at least one MR signal.

In some embodiments disclosed herein, a MR receive coil includes at least one MR coil element configured to receive MR signals excited in a subject disposed in an MR imaging device; and electronics configured to: receive a MR signal excited in a subject disposed in an MR imaging device: transform the MR signal with a coherence function representing the MR signal as an instantaneous frequency spectrum as a function of time: apply spectral filtering to the transformed MR signal; and reconstruct at least one medical image from the filtered MR signal.

In some embodiments disclosed herein, a MR receive coil includes at least one MR coil element configured to receive MR signals excited in a subject disposed in an MR imaging device; and electronics configured to: receive a plurality of MR signals excited in a subject disposed in an MR imaging device: transform the plurality of MR signals with a coherence function representing each signal of the plurality of MR signals as an instantaneous frequency spectrum as a function of time: apply spectral filtering to the transformed MR signals; and reconstruct at least one medical image from the filtered MR signals.

One advantage resides in suppressing incoherent noise from MR signals.

Another advantage resides in improving a signal-to-noise ratio (SNR) of MR signals.

Another advantage resides in using a coherence function to suppress short-duration noise from MR signals by enabling noise filtering that dynamically adjusts as a function of time.

Another advantage resides in leveraging expected partial coherence between channels of a multi-channel coil to improve MR signal noise filtering.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The disclosure may take form in various components and arrangements of components, and in various steps and arrangements of steps. The drawings are only for purposes of illustrating the preferred embodiments and are not to be construed as limiting the disclosure.

DETAILED DESCRIPTION

Figure 1:
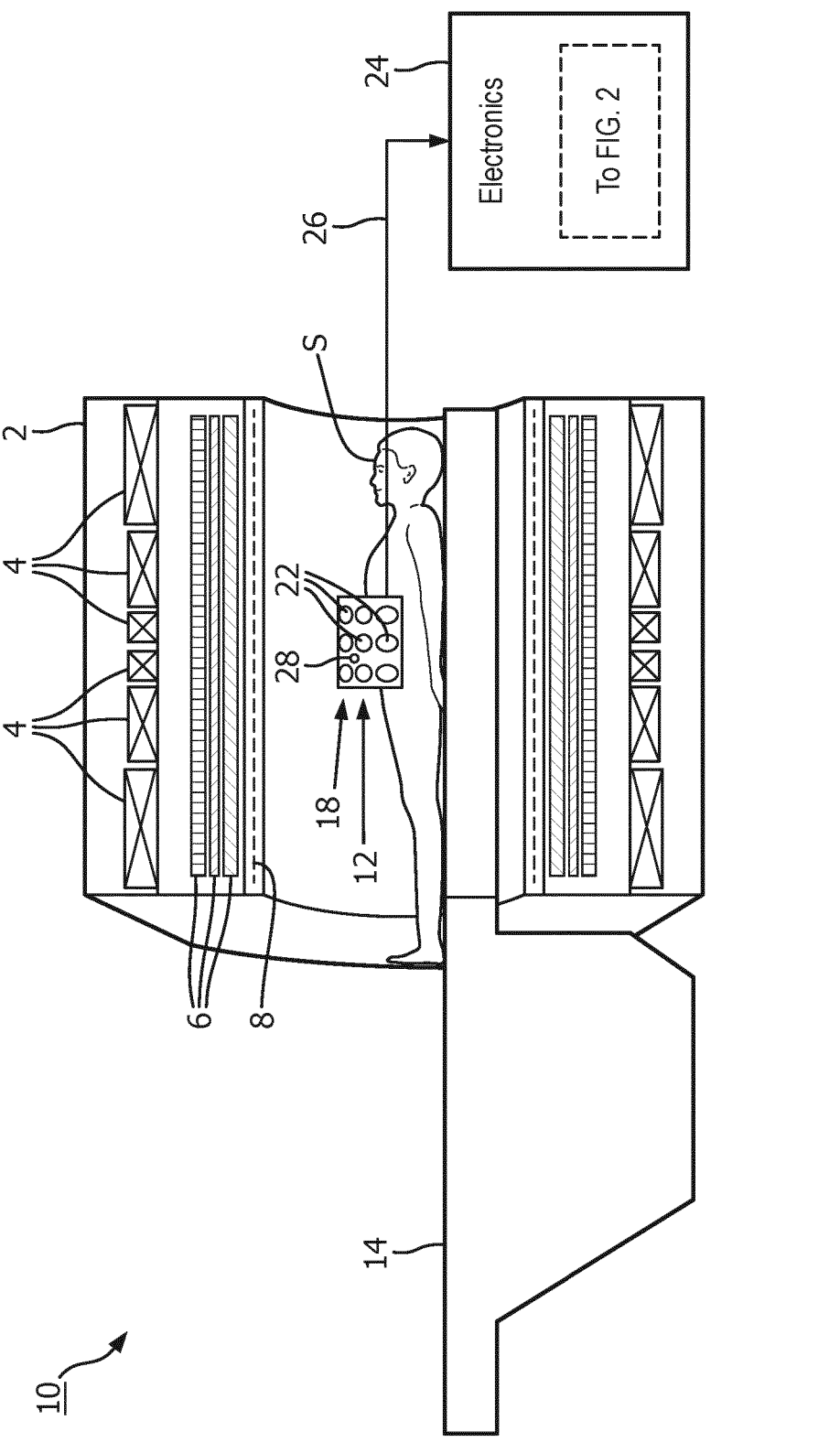
FIG. 1 diagrammatically illustrates a magnetic resonance (MR) imaging device including a MR coil element in accordance with the present disclosure.

Magnetic resonance imaging (MRI) signal processing is commonly done by transforming the signal into the frequency domain, for example using a Fast Fourier Transform

3

(FFT) and applying spectral filtering to the FFT-transformed signal. However, this approach applies the same spectral filtering across the time domain. If a noise signal appears briefly, for example in the case of intermittent noise or other short-duration noise, this time-global filter will not be well-tuned to suppress it. In embodiments disclosed herein, MR signal is transformed with a coherence function representing the at least one MR signal as an instantaneous frequency spectrum as a function of time, and spectral filtering is then applied to the transformed MR signal. In this way, the spectral filtering can be dynamically adjusted as a function of time, enabling more effective suppression of noise. If only a single MR receive channel is available (or if multiple MR receive channels are to be filtered independently), then the coherence function used may be an auto-coherence function. On the other hand, in the case of a multi-channel coil, in view of expected partial coherence between channels, the coherence function used may be a cross-coherence function applied on pairs of channels.

In present MR designs, MR signals are generated from the MR excitation in the subject. A two-dimensional (2D) representation (e.g., time and frequency) is required in order to define a coherence function, since a Fourier transform (FFT) of the signal does not provide information regarding the time when the MR signals are generated. Such a time-frequency representation can be used to identified instantaneous frequencies of the MR signals (see e.g., Francois Auger, Patrick Flandrin, Paulo Goncalves, Olivier Lemoine, "Time-Frequency Toolbox—For use with Matlab." CNRS (France), Rice University (USA), 1995-1996). Other examples of the time-frequency representation can be a Wigner-Ville distribution (WVD) of the MRI signals and/or a smoothed-pseudo-WVD (SPWVD).

In some embodiments disclosed herein, the signal is transformed using a coherence function, which represents the data as an instantaneous frequency spectrum as a function of time. In the case of processing a single MRI signal, the coherence function is suitably an auto-coherence function such as a Cohen-class time-frequency transform such as a Wigner-Ville distribution (WVD) or a smoothed pseudo-WVD (i.e., SPWVD). If multiple significantly correlated MRI signal channels are available, as is the case in a multi-channel MRI receive coil, then a cross-coherence function such as a mean-squared coherence can be used on a channel-pair basis.

To perform the filtering of the MRI signal, the coherence (e.g., auto-coherence or cross-coherence) is in an illustrative approach calculated on a scale of 0-1 (where 0 is completely incoherent and 1 is perfect coherence) for a time window around each datapoint in time, and the FFT of the signal in that time window is multiplied by the coherence value. Alternatively, the coherence value can be thresholded before performing the multiplication so as to completely suppress the signal at time intervals where the coherence is below the threshold.

With reference to FIG. 1, an illustrative magnetic resonance (MR) imaging system or device 10 for imaging a subject S (e.g., an illustrative human subject S such as a medical patient, or a veterinary subject, or an archaeological mummy, et cetera) comprises a magnetic resonance (MR) imaging scanner (also referred to herein as an MRI scanner), which in the illustrative example includes a housing or gantry 2 containing various components shown in FIG. 1, such as by way of non-limiting illustrative example a superconducting or resistive magnet 4 generating a static ($B_0$) magnetic field, magnetic field gradient coils 6 for superimposing magnetic field gradients on the $B_0$ magnetic field, a whole-body radio frequency (RF) coil 8 for applying RF pulses to excite and/or spatially encode magnetic resonance in an imaging patient disposed in an MR bore 12 or other MR examination region, and/or so forth. The magnet 4 and the gradient coils 6 are arranged concentrically about the bore 12. A robotic patient couch 14 or other patient support enables loading a medical patient, a patient undergoing a medical screening, or other imaging patient into the MR bore 12 for imaging.

The magnetic resonance excited in the imaging subject S is read out by an MR receive coil 18 that, in the illustrative embodiment, includes a plurality of MR coil elements 22. (In the limit, the number of coil elements may be 1, that is, the coil may have only a single coil element). Each coil element 22 is a radio frequency antenna for receiving MR signals excited in a subject disposed in the MR imaging device 10. Each coil element 22 typically forms an MR receive channel.

FIG. 1 shows an illustrative MR coil 18 (or, alternatively, coil array 18) with a plurality of illustrative coil elements 22. It will be appreciated that the coil 18 may in general include any number of coil elements 22, e.g., 16 coil elements, 20 coil elements, 32 coil elements, etc. Each coil element 22 is typically part of an MR receive channel that includes the MR coil element 22 configured to receive MR signals in an MR frequency band and a pre-amplifier and often other signal processing electronics. Each illustrative coil element 22 may be a single loop of copper, copper alloy, or another electrically conductive material, for example formed as a copper layer deposited on a circuit board, plastic sheet, plastic former, or other electrically insulating substrate; or alternatively formed as a freestanding metal loop. However, more generally the coil element 22 may be any suitable antenna capable of coupling with MR signals in the MR frequency band, e.g., a multi-loop coil or otherwise-shaped antenna. In some examples, MR coil 18 including the MR coil element (s) 22 is configured to be disposed in the examination region (i.e., the MR bore 12), as shown in FIG. 1.

Figure 2:
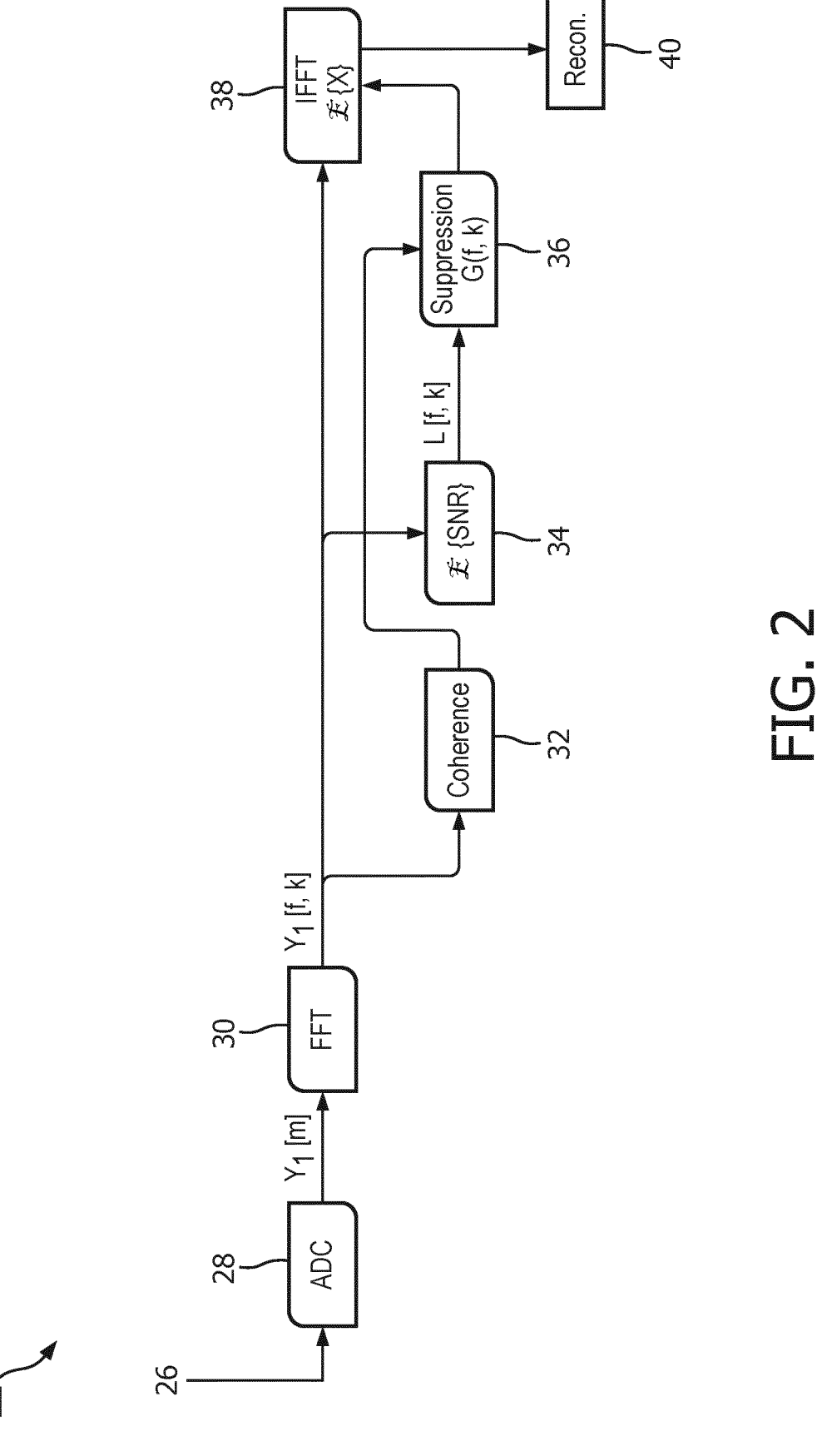
FIGS. 2 and 3 show modules for the device of FIG. 1.
Figure 3:
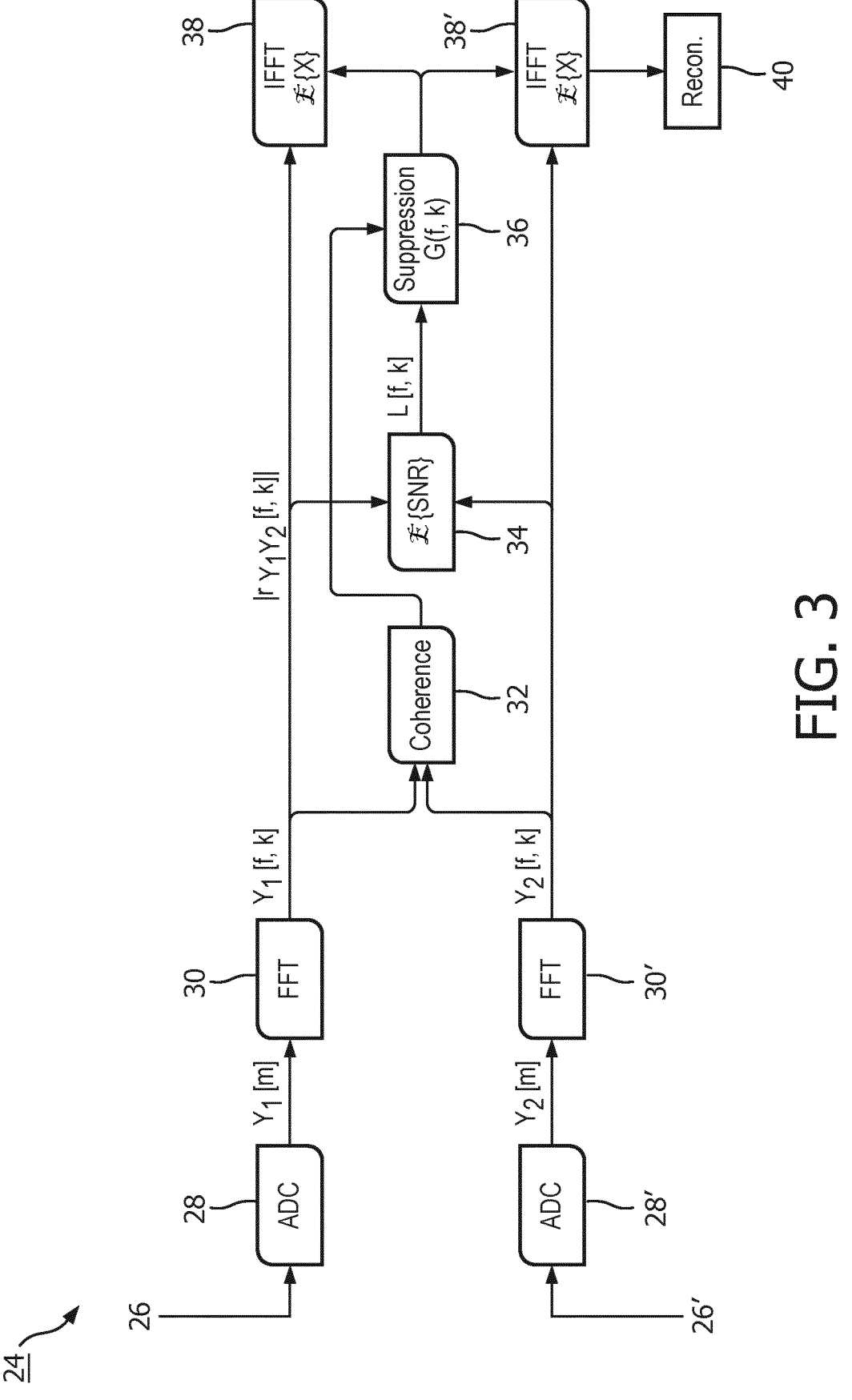

With reference to FIGS. 2 and 3, and with continuing reference to FIG. 1, electronics 24 (e.g., an electronic processor or more specifically a microprocessor) are configured to receive MR signals from the coil element(s) 22. In general, at least one MR signal 26 excited in the subject S in the MR imaging device 10 is received by the electronics 24 from the MR coil 18. In the illustrative embodiment employing the multi-channel coil 18, the MR signal 26 typically include an MR signal for each channel. The MR signal or signals 26 are then processed by an analog-to-digital converter (ADC; or bank of ADCs in the case of a multi-channel signal) 28 to convert the MR signal or signals 26 to corresponding digital signal(s).

The electronics 24 are programmed to transform the at least one MR signal 26 with a coherence function module 32 (see FIGS. 2 and 3) representing the at least one MR signal as an instantaneous frequency spectrum as a function of time. In the embodiment shown in FIG. 2, the at least one MR signal comprises a single MR signal 26. In these embodiments, the coherence function 32 comprises an auto-coherence function, such as a Cohen-class time-frequency transform, examples of which include a Wigner-Ville distribution (WVD) or a smoothed-pseudo-WVD (SPWVD). In such embodiments, when the at least one MR signal comprises a single MR signal 26, the coherence function comprises a SPWVD comprising a time window in a time domain, and an attenuation filter window in a frequency domain.

In the embodiment shown in FIG. 3, the at least one MR signal 26 comprises a plurality of MR signals 26 (FIG. 2 illustrates this with a second MR signal 26' and a second ADC 28, although any number of ADCs 28 can be included corresponding to the number of MR signals 26), and the coherence function 32 comprises a cross-coherence function. For example, each MR signal of the plurality of MR signals may be received from a corresponding channel of the illustrative multi-channel MR coil 18, and the cross-coherence function comprises a mean-squared coherence used on a channel-pair basis. In such embodiments, when the at least one MR signal 26 comprises a plurality of MR signals, the coherence function comprises a mean squared coherence function and each MR signal 26 is transformed by setting the MR signals 26 to zero when the mean squared coherence function outputs a coherence value below a zeroing threshold.

To perform the transforming, the digital MR signal 26 is processed by a FFT module 30 (or, if there are multiple MR signals 26, at least a second FFT module 30' is included) to transform the digital MR signal 26 into the frequency domain. In some examples, the transformed MR signal(s) 26 can be input to a signal-to-noise ratio (SNR) module 34 configured to suppress noise in the transformed MR signal (s) 26.

The electronics 24 then applying spectral filtering to the transformed at least one MR signal 26. To do so, the coherence function module 32 is programmed to calculate the coherence function on a predetermined scale for a selected time window around each datapoint in time of the at least one MR signal 26 to generate a coherence value. The FFT of the MR signal(s) 26 is multiplied in the selected time window by the coherence value. In some embodiments, prior to the multiplying, a suppression module 36 is configured to threshold the coherence value to completely suppress the signal at time intervals where the coherence is below a predetermined threshold while passing the signal unattenuated at time intervals where the coherence is above the predetermined threshold.

The filtered MR signal(s) 26 are then further processed by an inverse FFT (IFFT) module 38 (FIG. 2), or to the first IFFT module 38 and a second IFFT module 38' (FIG. 3) to further suppress noise in the filtered MR signal(s) 26. An image reconstruction module 40 is then programmed to process the filtered MR signal(s) 26 into one or more reconstructed medical images of the subject S.

Figure 4:
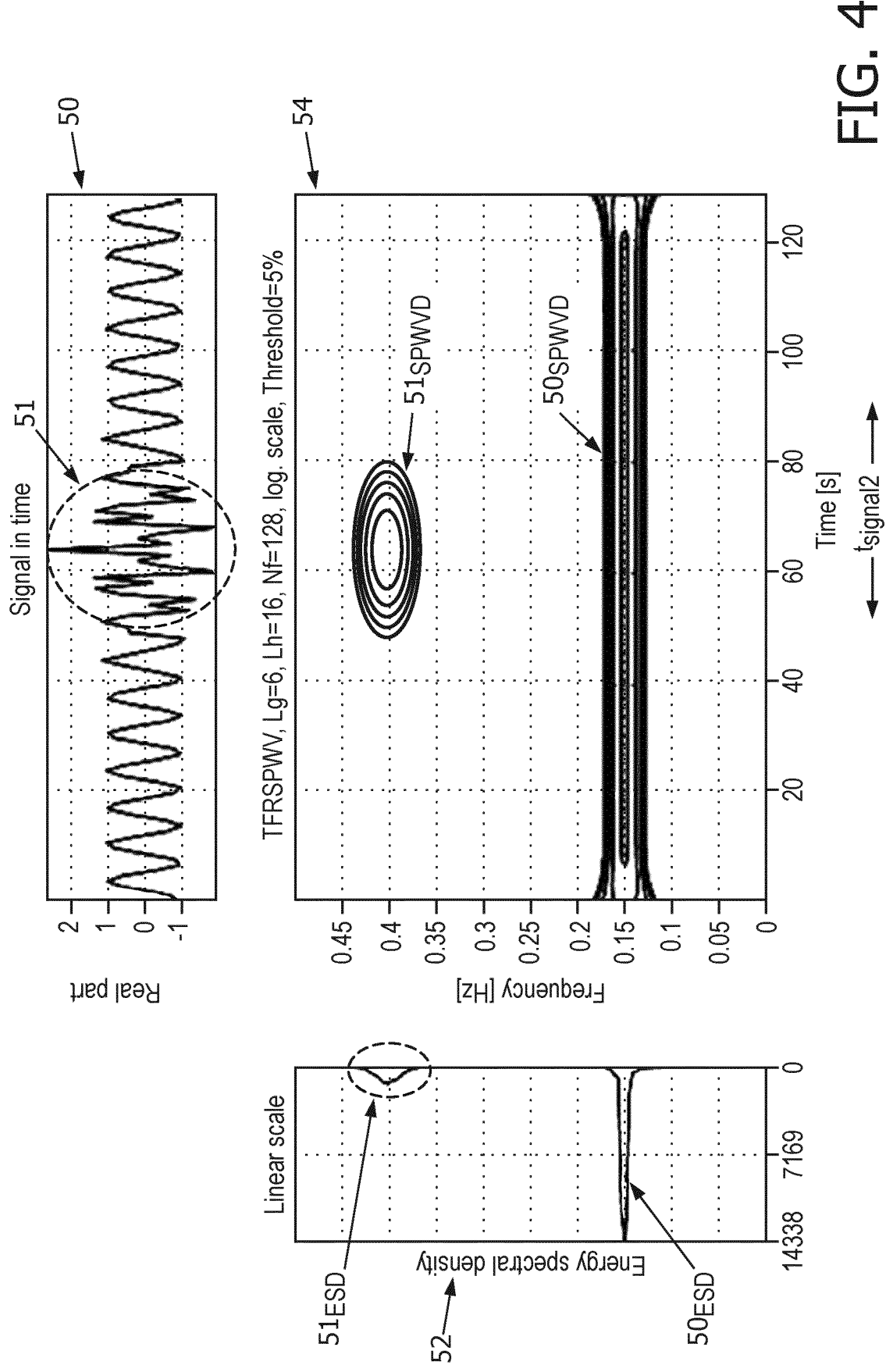
FIG. 4 diagrammatically shows suppression of a short-duration noise event using the disclosed approach.

With reference to FIG. 4, the way the disclosed approach employing the coherence function module 32 suppresses short-duration signal events is diagrammatically shown by way of simulated calculations. FIG. 4 plots a signal 50 as a function of time. A second signal event 51 is observed in this signal 50. On the left side of FIG. 4, a frequency-domain representation of the main signal 50 is shown as a corresponding energy spectral density (ESD) 52. The signal component 50 is seen in the energy spectral density 52 as a dominant peak $50_{ESD}$, while the second signal event 51 is seen in the energy spectral density 53 as a lower-amplitude higher-frequency peak $51_{ESD}$ that is well-separated from the main signal peak $50_{ESD}$. However, the energy spectral density 52 is not resolved as a function of time. This is also true of other typical frequency-domain representations of the MR signal 50, such as an FFT (not shown). Because the frequency-domain representation 52 is not resolved as a function of time, a noise filter operating on the frequency-domain representation 52 to remove noise must be applied globally over time. This can result in sub-optimal noise removal due to the filtering not being applied in some temporal areas within the short-duration signal event 51.

With continuing reference to FIG. 4, a coherence function transform of the MR signal 50 is shown as a smoothed pseudo-Wigner-Ville distribution (SPWVD) 54. The coherence transform 56 represents the at least one signal as an instantaneous frequency spectrum (plotted on the ordinate or vertical y-axis) as a function of time (plotted on the abscissa or horizontal x-axis). The signal component of the signal 50 is seen in the SPWVD 54 as a structure $50_{SPWVD}$ that extends over the entire plotted time interval, since as seen in the top plot of the signal 50 the signal extends over the entire plotted time interval. On the other hand, the secondary signal event 51 is seen in the SPWVD 54 as high-frequency feature $51_{SPWVD}$ that is well-separated from the main signal structure $50_{SPWVD}$ and is also temporally limited to a time interval $t_{signal2}$ indicated in the SPWVD 54. Since the second signal event 51 is resolved as a function of time in the SPWVD 54, a noise filter operating on the SPWVD 54 to remove noise can be applied in a temporally limited manner. e.g., excluding the time interval $t_{signal2}$ or some time interval slightly larger than $t_{signal2}$. This enables noise filtering that dynamically adjusts as a function of time, which avoids the undesirable signal loss or sub-optimal noise removal that can occur filtering when short-duration signal events are present using an FFT. ESD, or other frequency-domain representation that is not resolved as a function of time.

Figure 5:
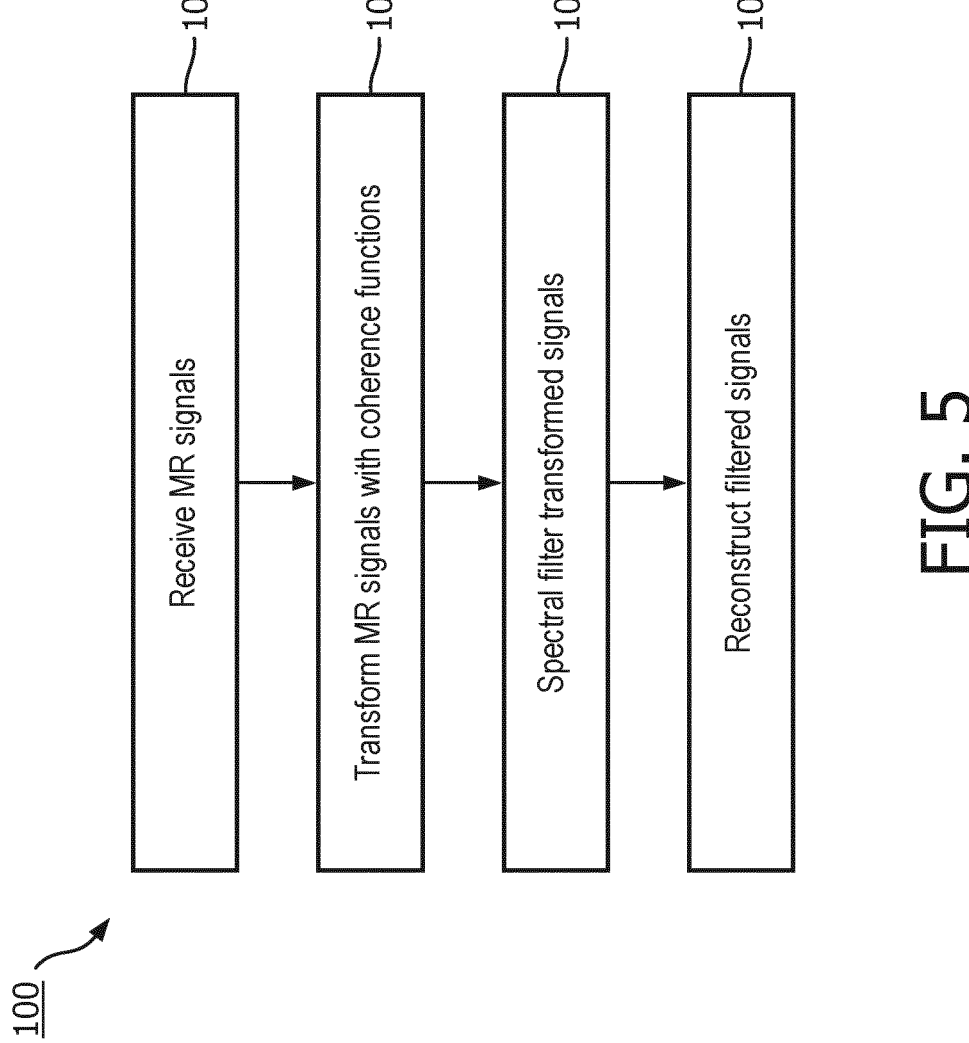
FIG. 5 diagrammatically illustrates an MRI imaging method using the device of FIG. 1.

With reference to FIG. 5, and with returning reference to FIGS. 1 and 2, an illustrative imaging method 100 using the MR device 10 is diagrammatically shown as a flowchart. To being the method 100, a patient is loaded onto the couch 14 and into the bore 12. The MR coil 18 is placed onto the patient. At an operation 102, the MR signal(s) 26 are received by the electronics 24. At an operation 104, the MR signal(s) 26 are transformed with a coherence function representing the MR signal(s) 26 as an instantaneous frequency spectrum as a function of time. At an operation 106, the transformed MR signal(s) 26 are spectral filtered. At an operation 108, the filtered MR signal(s) 26 are reconstructed into at least one medical image.

EXAMPLE

With continuing reference to FIG. 2, based on M observations of the MRI signals in a single channel: each one composed of signal and noise $y_i(m)=x_i(m)+n_i(m)$, and $y_i(m)$ is the signal to be estimated. The index i is the signal component from channel i, and m is the sample value. The signal is strongly correlated with itself, and the assumption is that the signal comes with uncorrelated noise sources (signals that do not carry information). The value of the coherence function is the primary metric used to determine if a signal exists or not. Furthermore, no learning of the noise statistics is necessary just the received present observations of the signals. If the amplitude of the coherence function between noisy signals (same or different channels) is equal to one or close to one, the signal is predominant, and it must be passed without distortion.

The MRI signals are spatially separated such that each signal is represented according to Equation 1:

$$y_i[m] = x_i[m] + n_i[m], [i = 1,2,3, \ldots ] \tag{1}$$

such that $n_i(m)$ represents the noise, $x_i(m)$ the signal of interest without noise and $y_i(m)$ the noisy signal, with i channels and m samples. The FFT can be done with blocks of M samples, or a subset of M (Q<M) using overlap-add methods of sliding window FFT filtering. Generally, the FFT resolution can be made M from Q using standard zero filling techniques. After taking the FFT of the signal, the signals are represented according to Equation 2:

$$Y_i[f, k] = X_i[f, k] + N_i[f, k], [i = 1,2,3, \dots ] \qquad (2)$$

with $f$ being the frequency bin and k the frame index, respectively. In a two-channel coil example, as shown in FIG. 3, with the signals and noise being uncorrelated, the cross-power spectral density of $Y_i[f, k]$ is represented according to Equation 3:

$$P_{Y_1 Y_2}[f, k] = [f, k] + P_{N_1 N_2}[f, k], \qquad (3)$$

where $P_{uv}[f, k]=E\{U[f, k]V^*[f, k]\}$ comprises the cross-spectral density as the expected value of their multiplicative functions. Thus, the magnitude coherence function between the signals $y_1[m]$ and $y_2[m]$ is defined according to Equation 4:

$$|\Gamma_{Y_1 Y_2}[f, k]| = \frac{|P_{Y_1 Y_2}[f, k]|}{\sqrt{P_{Y_1}[f, k]}\sqrt{P_{Y_2}[f, k]}} \qquad (4)$$

Then, the mean-squared coherence (MSC) is equal to $|\Gamma_{Y_1 Y_2}[f, k]|^2$ which will be used to turn-off uncorrelated signals and pass correlated signals. The observations having a coherence function between 0 and 1, a weighting criterion decision can be implemented. The function acts directly on the frequency bins.

This two-channel coherence process described above may be applied to all other channel pairs and determination of what frequency bins to zero, would be based on an OR algorithm of the suppression function output.

Several suppression functions can be designed to cancel the incoherent noise of the signals (see, e.g., Nima Yousefian, Kostas Kokkinakis and Philipos C. Loizou, "A Coherence-based Algorithm for Noise Reduction in Dual-Microphone Applications", 18th European Signal Processing Conference (EUSIPCO-2010), August 2010), where the suppression function is represented according to Equation 5:

$$G[f, k] = \begin{cases} 1 & \text{if } |\Gamma_{Y_1 Y_2}[f, k]| \geq Th \\ 0 & \text{if } |\Gamma_{Y_1 Y_2}[f, k]| < Th \end{cases} \qquad (5)$$

where $\Gamma_{Y_1 Y_2}[f, k]$ is the coherence of the noisy signals at the channels such that the function G[f, k] attenuates all frequency components with coherence<Th.

The final signal value (in frequency space) is then computed as $Y_1[f,k]*G[f,k]$ (for signal $Y_1$ which is the FFT of $y_1[m]$); and similarly, $Y_2[f,k]*G[f,k]$ (for signal $Y_2$ which is the FFT of $y_2[m]$).

Furthermore, for single channel coherence based denoising, the SPWVD algorithm is used, the auto-coherence can be calculated directly from the sampled signals instead of using the coherence function, according to Equation 6:

$$SPW(t, v)_x = \int_{-\infty}^{+\infty} h(\tau) \int_{-\infty}^{+\infty} g(s - t)x(s + \frac{\tau}{2})x^*\left(s - \frac{\tau}{2}\right)ds \, e^{-j2\pi v t}d\tau, \qquad (6)$$

where t=time, $\upsilon$ is frequency, h (t) is a time-window to reduce cross terms in the time domain, while the g(t) attenuation window filter is used to smooth or minimize cross terms between components in the frequency domain.

$$G[f, k] = \begin{cases} 1 & \text{if } SPW(t, v)_x \geq Th \\ 0 & \text{if } SPW(t, v)_x < Th \end{cases} \qquad (7)$$

The final signal value (in frequency space) is then computed as Y[f,k]*G[f,k] (for signal Y which is the FFT of y[m]).

Note that the notation to the signal here is continuous rather than discrete.

In the case of N-channel array of coil elements, this method is repeated for each pair of couple coils. Knowledge of the coupling (noise resistive coupling and mutual inductance signal coupling could be incorporated into the method.

This description is for a ID SPWVD using a sliding window FFT in the frequency dimension as this data acquisition dimension is generally the fast data acquisition direction associated with high speed A/D, but this technique could also be applied in the k-space line dimension (k) after all the k-space lines are collected, such that there is a 2D noise reduction algorithm The disclosure has been described with reference to the preferred embodiments. Modifications and alterations may occur to others upon reading and understanding the preceding detailed description. It is intended that the exemplary embodiment be construed as including all such modifications and alterations insofar as they come within the scope of the appended claims or the equivalents thereof.

The invention claimed is:

1. A device configured to filter magnetic resonance (MR) signals, the device comprising at least one electronic processor programmed to:

receive at least one MR signal excited in a subject disposed in an MR imaging device;

transform the at least one MR signal with a coherence function representing the at least one MR signal as an instantaneous frequency spectrum as a function of time;

apply spectral filtering to the transformed at least one MR signal; and reconstruct at least one medical image from the filtered at least one MR signal, wherein the at least one MR signal comprises a plurality of MR signals, and the coherence function comprises a cross-coherence function; and wherein each MR signal of the plurality of MR signals is received from a corresponding channel in a MR coil, and the cross-coherence function comprises a mean-squared coherence used on a channel-pair basis.

2. The device of claim 1, wherein the transforming includes transforming the at least one MR signal into the frequency domain using a Fast Fourier Transform (FFT), and filtering comprises:

calculating the coherence function on a predetermined scale for a selected time window around each datapoint in time of the at least one MR signal to generate a coherence value; and multiplying the FFT of the at least one MR signal in the selected time window by the coherence value.

3. The device of claim 2, wherein the filtering further includes:

prior to the multiplying, thresholding the coherence value to completely suppress the signal at time intervals where the coherence is below a predetermined threshold.

4. A magnetic resonance (MR) receive coil, comprising:

at least one MR coil element configured to receive MR signals excited in a subject disposed in an MR imaging device; and electronics configured to:

receive a MR signal excited in a subject disposed in an MR imaging device;

transform the MR signal with a coherence function representing the MR signal as an instantaneous frequency spectrum as a function of time;

apply spectral filtering to the transformed MR signal; and reconstruct at least one medical image from the filtered MR signal, wherein the at least one MR signal comprises a plurality of MR signals, and the coherence function comprises a cross-coherence function; and wherein each MR signal of the plurality of MR signals is received from a corresponding channel in a MR coil, and the cross-coherence function comprises a mean-squared coherence used on a channel-pair basis.

5. The MR receive coil of claim 4, wherein the filtering further includes:

prior to the multiplying, thresholding the coherence value to completely suppress the signal at time intervals where the coherence is below a predetermined threshold.

6. A magnetic resonance imaging system configured to image a subject, the system comprising the magnetic resonance receive coil of claim 4.

\* \* \* \* \*